United States Patent
Chien et al.

(10) Patent No.: US 9,448,121 B2
(45) Date of Patent: Sep. 20, 2016

(54) MEASUREMENT METHOD, MEASUREMENT APPARATUS, AND COMPUTER PROGRAM PRODUCT

(71) Applicant: Industrial Technology Research Institute, Hsinchu (TW)

(72) Inventors: Heng-Chieh Chien, New Taipei (TW); Ming-Ji Dai, Hsinchu (TW); Sheng-Tsai Wu, Taoyuan County (TW); Huey-Lin Hsieh, Tainan (TW); Jing-Yi Huang, Kaohsiung (TW)

(73) Assignee: Industrial Technology Research Institute, Hsinchu (TW)

( * ) Notice: Subject to any disclaimer, the term of this patent is extended or adjusted under 35 U.S.C. 154(b) by 754 days.

(21) Appl. No.: 13/854,139

(22) Filed: Apr. 1, 2013

(65) Prior Publication Data

US 2013/0276464 A1 Oct. 24, 2013

Related U.S. Application Data

(60) Provisional application No. 61/622,024, filed on Apr. 10, 2012.

(30) Foreign Application Priority Data

Aug. 10, 2012 (TW) .............................. 101129042 A

(51) Int. Cl.
*G01K 1/00* (2006.01)
*G01K 7/00* (2006.01)
(Continued)

(52) U.S. Cl.
CPC ................ *G01K 7/00* (2013.01); *F25B 21/04* (2013.01); *G01K 3/08* (2013.01); *H01L 35/30* (2013.01); *H01L 35/32* (2013.01)

(58) Field of Classification Search
CPC ........ G01K 15/00; G01K 1/026; G01K 7/00; G01K 7/12
USPC ........................................................ 702/130
See application file for complete search history.

(56) References Cited

U.S. PATENT DOCUMENTS 6,487,515 B1 11/2002 Ghoshal
6,902,317 B2 6/2005 Koinuma et al.
(Continued)

FOREIGN PATENT DOCUMENTS

CN 101354388 1/2009
CN 102297877 12/2011
(Continued)

OTHER PUBLICATIONS

Mitrani, D.; Tome, J.A.; Salazar, J.; Turo, A.; Garcia, M.J.; Chavez, J.A., "Dynamic measurement system of thermoelectric module parameters," in Thermoelectrics, 2003 Twenty-Second International Conference on—ICT , vol., no., pp. 524-527, Aug. 17-21, 2003 doi: 10.1109/ICT.2003.1287564 URL: http://ieeexplore.ieee.org.*
(Continued)

*Primary Examiner* — Manuel L Barbee
*Assistant Examiner* — Jeremy Bishop
(74) *Attorney, Agent, or Firm* — Jianq Chyun IP Office

(57) ABSTRACT

A measurement method, a measurement apparatus, and a computer program product for measuring a thermoelectric module are provided. A temperature is provided to the thermoelectric module. A current is applied to the thermoelectric module to turn both sides of the thermoelectric module into a hot side and a cold side. The temperature of the hot side is higher than that of the cold side. A terminal voltage of the thermoelectric module, a hot side temperature of the hot side, and a cold side temperature of the cold side are measured at different time points. A thermoelectric relationship between the terminal voltages and differences between the hot side temperatures and the corresponding cold side temperatures is obtained according to the terminal voltages, the hot side temperatures, and the cold side temperatures. At least one first parameter of the thermoelectric module is estimated according to the thermoelectric relationship.

49 Claims, 8 Drawing Sheets

(51) Int. Cl.
*F25B 21/04* (2006.01)
*G01K 3/08* (2006.01)
*H01L 35/30* (2006.01)
*H01L 35/32* (2006.01)

(56) References Cited

U.S. PATENT DOCUMENTS

| | | | |
|---|---|---|---|
| 7,072,782 | B2 | 7/2006 | Matsuo et al. |
| 7,645,070 | B2 | 1/2010 | Atwood et al. |
| 9,140,612 | B2 * | 9/2015 | Snyder .................. G01K 7/02 |
| 2004/0040592 | A1 * | 3/2004 | Schneider ............. G01K 7/021 |
| | | | 136/224 |
| 2004/0107704 | A1 | 6/2004 | Hudson et al. |
| 2005/0051807 | A1 | 3/2005 | Verhaegen |
| 2012/0174955 | A1 * | 7/2012 | Hwang .................. H01L 35/32 |
| | | | 136/203 |

FOREIGN PATENT DOCUMENTS

| | | |
|---|---|---|
| JP | 2007005359 | 1/2007 |
| JP | 2007005359 A * | 1/2007 |
| JP | 2009210378 | 9/2009 |
| TW | 200712463 | 4/2007 |
| TW | 200845439 | 11/2008 |
| TW | 200903872 | 1/2009 |
| TW | 201116820 | 5/2011 |

OTHER PUBLICATIONS

Mitrani, D.; Tome, J.A.; Salazar, J.; Turo, A.; GArcia, M.J.; Chavez, J.A., "Methodology for extracting thermoelectric module parameters," in Instrumentation and Measurement Technology Conference, 2004. IMTC 04. Proceedings of the 21st IEEE, vol. 1, no., pp. 564-568 vol. 1, May 18-20, 2004 doi: 10.1109/IMTC.2004.1351112 URL: http://ieeexplore.ieee.org.*

ET Chu et al.,"A novel method to rapidly determine the key properties of thermoelectric devices", May 30, 2012-Jun. 1, 2012,2012 13th IEEE Intersociety Conference onThermal and Thermomechanical Phenomena in Electronic Systems (ITherm), pp. 93-98.*

R. Ahiska, et al., "New method for investigation of parameters of real thermoelectric modules", Energy Conversion and Management, vol. 51,2010, pp. 338-345.

Yasutoshi Noda, et al., "Preparation and Characterization of Segmented-Type Thermoelectric Branches of Bi2Te3/PbTe", IEEE, 16th International Conference on Thermoelectrics, 1997, pp. 371-374.

Bunyamin Ciylan, et al., "Design of a thermoelectric module test system using a novel test method", International Journal of Thermal Sciences, vol. 46,2007, pp. 717-725.

D.M. Rowe, et al., "Evaluation of thermoelectric modules for power generation", Journal of Power Sources, vol. 73, 1998, pp. 193-198.

T. C. Harman, et al., "Measurement of Thermal Conductivity by Utilization of the Peltier Effect", Journal of Applied Physics, Vo. 30, No. 8, Sep. 1959, pp. 1351-1359.

G. Gromov, et al., "Z-meter: Easy-to-use Application and Theory", Proceedings. Sixth European Workshop on Thermoelectricity of the European Thermoelectric Society, Freiburg im Breisgau, Sep. 2001, pp. 1-8.

Daniel Mitrani, et al., "Methodology for Extracting Thermoelectric Module Parameters", IEEE, Transactions on Instrumentation and Measurement, vol. 54, No. 4, Aug. 2005, pp. 1548-1552.

* cited by examiner

MEASUREMENT METHOD, MEASUREMENT APPARATUS, AND COMPUTER PROGRAM PRODUCT

CROSS-REFERENCE TO RELATED APPLICATION

This application claims the priority benefits of U.S. provisional application Ser. No. 61/622,024, filed on Apr. 10, 2012 and Taiwan application serial no. 101129042, filed on Aug. 10, 2012. The entirety of each of the above-mentioned patent applications is hereby incorporated by reference herein and made a part of this specification.

TECHNICAL FIELD

The disclosure relates to a measurement method, a measurement apparatus, and a computer program product, and relates to a measurement method, a measurement apparatus, and a computer program product for measuring a thermoelectric module.

BACKGROUND

Presently, research regarding the application of thermoelectric effect is in a whole new stage. In last few years, the thermoelectric technology has been focused on the development of high-performance thermoelectric materials. Thus, related measurement techniques of the time have been focused on the measurement of thermoelectric properties of thermoelectric materials. In recent years, thermoelectric research has changed from material-oriented to module-oriented. Namely, the development focus has been moved onto the overall performance of assembled thermoelectric modules.

A thermoelectric module is composed of a plurality of thermoelectric pillar P/N pairs, a plurality of metal electrode traces, a plurality of solder layers, and two ceramic substrates. The overall thermoelectric property after foregoing components are assembled is different from that of the original thermoelectric pillars. For example, an atom diffusion problem arises between the thermoelectric pillars and the solder layers and accordingly the thermoelectric performance of the thermoelectric pillars inside the thermoelectric module is reduced. Regarding thermal conduction between the cold side and the hot side of a thermoelectric module, unknown but obvious interface thermal resistances exist between the thermoelectric pillars and the solder layers, between the solder layers and the electrode traces, and between the electrode traces and the substrates. Thus, in an application, the actual temperature difference of the thermoelectric pillars is smaller than that applied to both sides of the thermoelectric module. As a result, the actual performance of the thermoelectric module is different from what is expected, and this difference cannot be accurately estimated.

SUMMARY

An embodiment of the disclosure provides a measurement method for measuring a thermoelectric module. The measurement method includes following steps. A temperature is provided to the thermoelectric module. A current is applied to the thermoelectric module to turn both sides of the thermoelectric module respectively into a hot side and a cold side. Herein the temperature of the hot side is higher than that of the cold side. A terminal voltage of the thermoelectric module, a hot side temperature of the hot side, and a cold side temperature of the cold side are measured at each of a plurality of time points during a first time. A plurality of differences between the hot side temperatures and the corresponding cold side temperatures are calculated according to the terminal voltages, the hot side temperatures, and the cold side temperatures measured at the time points during the first time to obtain a thermoelectric relationship between the terminal voltages and the differences. At least one first parameter of the thermoelectric module is estimated according to the thermoelectric relationship.

An embodiment of the disclosure provides a measurement apparatus for measuring a thermoelectric module. The measurement apparatus includes a power supply unit, a voltage measurement unit, a temperature measurement unit, and a processing unit. The power supply unit applies a current to the thermoelectric module to turn both sides of the thermoelectric module respectively into a hot side and a cold side. Herein the temperature of the hot side is higher than that of the cold side. The voltage measurement unit measures a terminal voltage of the thermoelectric module at each of a plurality of time points during a first time. The temperature measurement unit measures a hot side temperature of the hot side and a cold side temperature of the cold side at each of the time points during the first time. The processing unit calculates a plurality of differences between the hot side temperatures and the corresponding cold side temperatures according to the terminal voltages, the hot side temperatures, and the cold side temperatures measured at the time points during the first time to obtain a thermoelectric relationship between the terminal voltages and the differences. The processing unit estimates at least one first parameter of the thermoelectric module according to the thermoelectric relationship.

An embodiment of the disclosure provides a computer program product in a computer readable medium for measuring a thermoelectric module. The computer program product includes first instructions, second instructions, third instructions, fourth instructions, and fifth instructions. The first instructions are to provide a temperature to the thermoelectric module. The second instructions are to supply a current to the thermoelectric module to turn both sides of the thermoelectric module respectively into a hot side and a cold side. Herein the temperature of the hot side is higher than the temperature of the cold side. The third instructions are to measure a terminal voltage of the thermoelectric module, a hot side temperature of the hot side, and a cold side temperature of the cold side at each of a plurality of time points during a first time. The fourth instructions are to calculate a plurality of differences between the hot side temperatures and the corresponding cold side temperatures according to the terminal voltages, the hot side temperatures, and the cold side temperatures measured at the time points during the first time, so as to obtain a thermoelectric relationship between the terminal voltages and the differences. The fifth instructions are to estimate at least one first parameter of the thermoelectric module according to the thermoelectric relationship.

Several exemplary embodiments accompanied with figures are described in detail below to further describe the disclosure in details.

BRIEF DESCRIPTION OF THE DRAWINGS

The accompanying drawings are included to provide further understanding, and are incorporated in and constitute a part of this specification. The drawings illustrate exem

DETAILED DESCRIPTION OF DISCLOSED EMBODIMENTS

Figure 1:
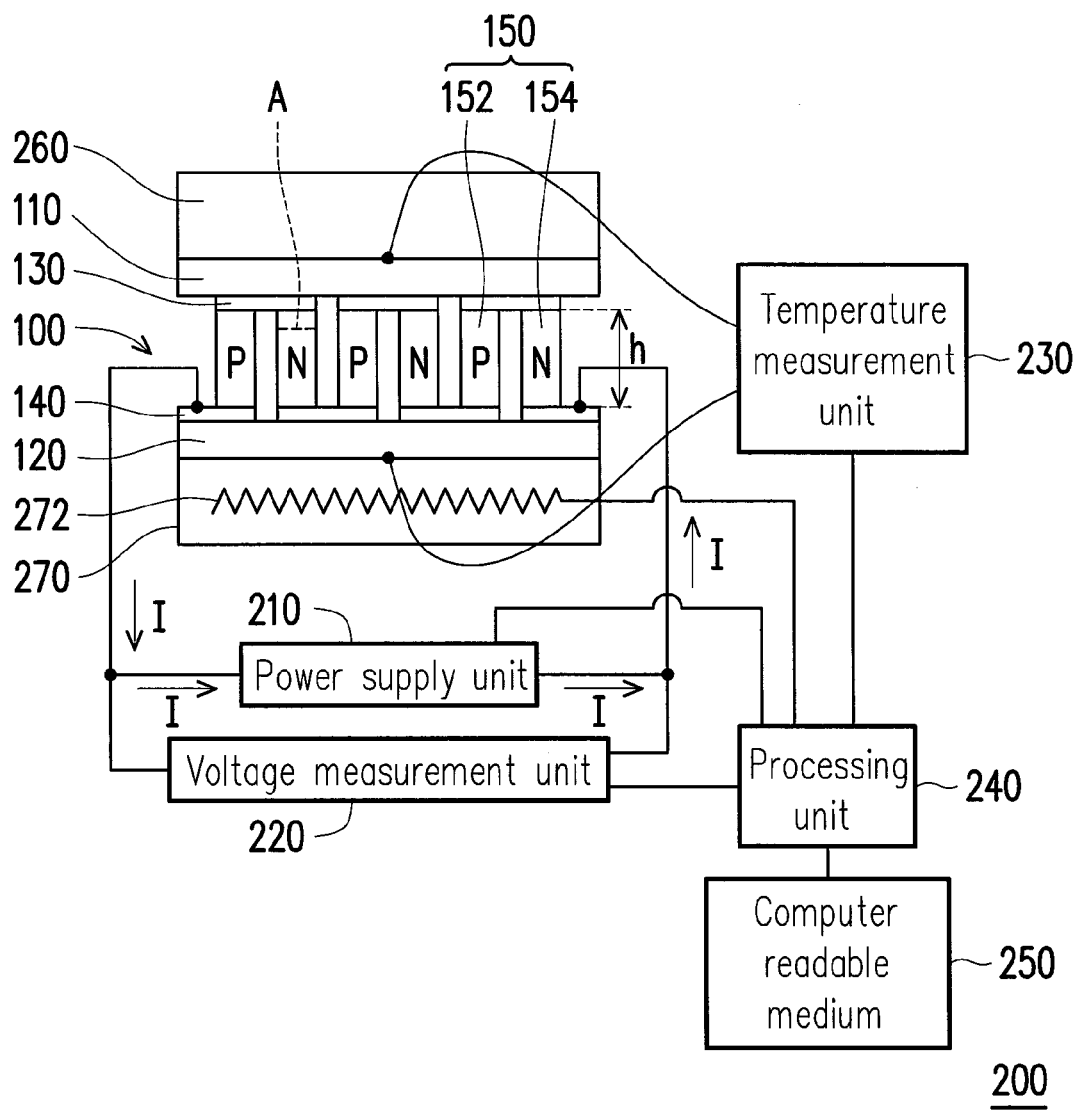
- FIG. 1 is a diagram of a measurement apparatus according to an embodiment of the disclosure.
Figure 2:
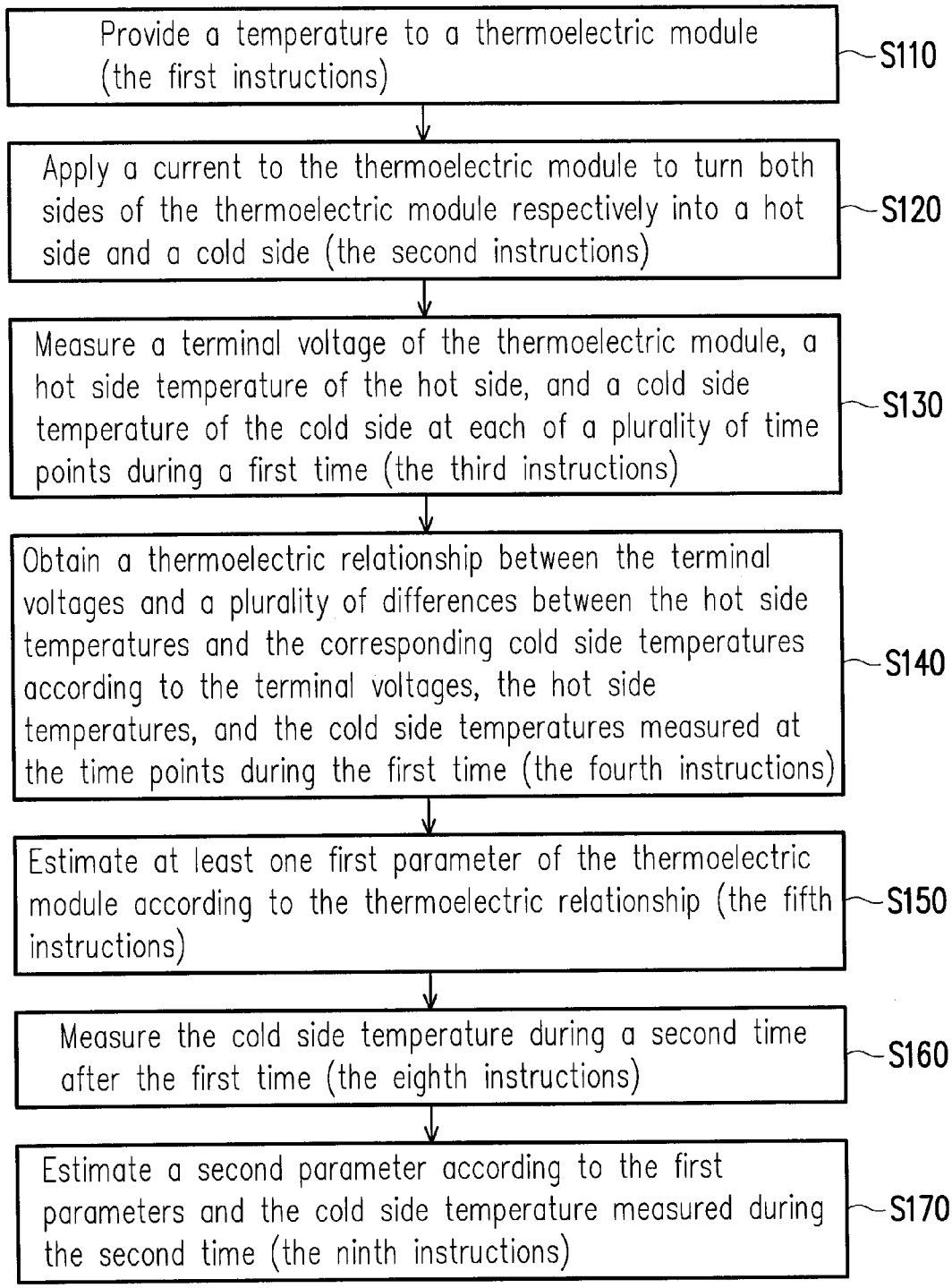
FIG. 2 is a diagram of a measurement method adapted to the measurement apparatus in FIG. 1.
Figure 3:
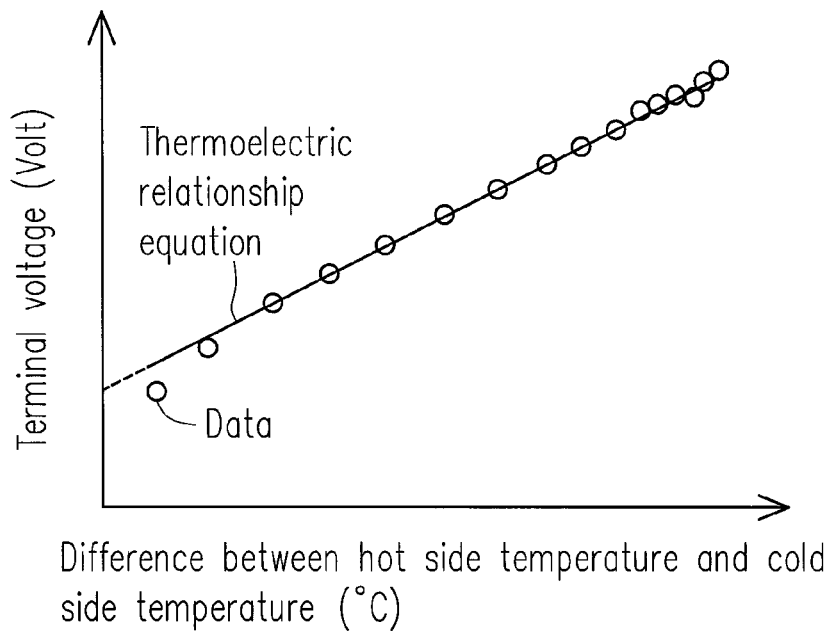
FIG. 3 is a diagram illustrating a straight line represented by a thermoelectric relationship equation obtained in the measurement apparatus in FIG. 1 and the measurement method in FIG. 2.

FIG. 1 is a diagram of a measurement apparatus according to an embodiment of the disclosure. FIG. 2 is a diagram of a measurement method adapted to the measurement apparatus in FIG. 1. FIG. 3 is a diagram illustrating a straight line represented by a thermoelectric relationship equation obtained in the measurement apparatus in FIG. 1 and the measurement method in FIG. 2. Referring to FIGS. 1-3, the measurement apparatus 200 in the embodiment is used for measuring a thermoelectric module 100. The thermoelectric module 100 includes a first substrate 110, a second substrate 120, and M pairs of thermoelectric pillars 150 that are electrically connected with each other. Herein M is a positive integer, and each pair of thermoelectric pillars 150 connects the first substrate 110 and the second substrate 120. In the embodiment, the first substrate 110 and the second substrate 120 may be ceramic substrates. However, in other embodiments, the first substrate 110 and the second substrate 120 may also be substrates made of other materials. In addition, in the embodiment, each pair of thermoelectric pillars 150 includes a P-type semiconductor pillar 152 and a N-type semiconductor pillar 154, the P-type semiconductor pillar 152 connects the first substrate 110 and the second substrate 120, and the N-type semiconductor pillar 154 connects the first substrate 110 and the second substrate 120. The P-type semiconductor pillar 152 may be made of P-type Bi—Te alloy, P-type Pb—Te alloy, P-type Bi—Sb—Te alloy, P-type Si—Ge alloy, or any other P-type semiconductor material. The N-type semiconductor pillar 154 may be made of N-type Bi—Te alloy, N-type Pb—Te alloy, N-type Bi—Sb—Te alloy, N-type Si—Ge alloy, or any other N-type semiconductor material.

In the embodiment, the thermoelectric module 100 further includes a patterned conductive layer 130 and a patterned conductive layer 140 respectively disposed on the first substrate 110 and the second substrate 120. The patterned conductive layer 130 and the patterned conductive layer 140 serially connect the M pairs of thermoelectric pillars 150, and the M pairs of thermoelectric pillars 150 are serially connected by alternately connecting the P-type semiconductor pillars 152 and the N-type semiconductor pillars 154. In addition, in the embodiment, each pair of thermoelectric pillars 150 is connected to the first substrate 110 through the patterned conductive layer 130 and connected to the second substrate 120 through the patterned conductive layer 140. A material of the patterned conductive layer 130 and the patterned conductive layer 140 may be metal.

The measurement apparatus 200 includes a power supply unit 210, a voltage measurement unit 220, a temperature measurement unit 230, and a processing unit 240. The power supply unit 210 supplies a current I to the thermoelectric module 100 to turn both sides of the thermoelectric module 100 respectively into a hot side and a cold side. Herein the temperature of the hot side is higher than that of the cold side. In the embodiment, the current I is substantially a constant current, and the current I runs through the serially connected M pairs of thermoelectric pillars 150. In other words, the current I alternately runs through the P-type semiconductor pillars 152 and the N-type semiconductor pillars 154. Additionally, in the embodiment, when the current I is supplied to the thermoelectric module 100, the temperature of the first substrate 110 drops so that the cold side is formed, and the temperature of the second substrate 120 rises so that the hot side is formed.

In the embodiment, the measurement apparatus 200 further includes a heat insulator 260 and a temperature control element 270. The heat insulator 260 is disposed on the cold side (i.e., the first substrate 110). The temperature control element 270 is disposed on the hot side (i.e., the second substrate 120) for regulating the temperature of the hot side. Thus, the temperature control element 270 can provide a temperature to the thermoelectric module 100 before the current I is applied to the thermoelectric module 100. In the embodiment, the temperature control element 270 may be a hot plate with a heating unit 272. Herein the heating unit 272 may be a thermal resistor or any other heating element.

The voltage measurement unit 220 measures a terminal voltage V (the voltage over two ends of the serially and alternately connected P-type semiconductor pillars 152 and N-type semiconductor pillars 154) of the thermoelectric module 100 at each of a plurality of time points during a first time. The first time may be from the time point at which the current I is first applied to the thermoelectric module 100 to the time point at which the difference ΔT between a hot side temperature $T_h$ of the hot side and a cold side temperature $T_c$ of the cold side in the thermoelectric module 100 is substantially stabilized. For example, if the difference ΔT is stabilized within 20 seconds after the current I is first applied, the first time is 20 seconds after the current I is first applied.

The temperature measurement unit 230 measures the hot side temperature $T_h$ of the hot side and the cold side temperature $T_c$ of the cold side at each time point during the first time. In the embodiment, the temperature measurement unit 230 includes a thermal couple which contacts the surface of the first substrate 110 facing the heat insulator 260. The thermal couple is used for measuring the cold side temperature $T_c$. The temperature measurement unit 230 also includes a thermal couple which contacts the surface of the second substrate 120 facing the temperature control element 270. This thermal couple is used for measuring the hot side temperature $T_h$. The temperature measurement unit 230 further includes an interpretation platform electrically connected to foregoing two thermal couples. The interpretation platform is used for interpreting temperature signals measured by the thermal couples. In other embodiments, the thermal couples may be replaced by other temperature sensors.

The processing unit 240 calculates the differences $\Delta T$ between the hot side temperatures $T_h$ and the corresponding cold side temperatures $T_c$ according to the terminal voltages V, the hot side temperatures $T_h$, and the cold side temperatures $T_c$ measured at the time points during the first time, so as to obtain a thermoelectric relationship between the terminal voltages V and the differences $\Delta T$. In the embodiment, the processing unit 240 may be a central processing unit (CPU) in a computer. However, in other embodiments, the processing unit 240 may also be a digital signal processor (DSP), a digital logic circuit, or any other suitable processor on any other control and operation platform. In the embodiment, a set of data including the terminal voltage V, the cold side temperature $T_c$, and the hot side temperature $T_h$ is measured at each of the time points during the first time. The processing unit 240 obtains a difference $\Delta T$ by subtracting the cold side temperature $T_c$ from the hot side temperature $T_h$. The technique of obtaining the thermoelectric relationship between the terminal voltages V and the differences $\Delta T$ according to the terminal voltages V, the hot side temperatures $T_h$, and the cold side temperatures $T_c$ measured at the time points during the first time includes performing a linear regression according to the terminal voltages V and the corresponding differences $\Delta T$ (i.e., according to a plurality of sets of data including the terminal voltages V and the differences $\Delta T$) to obtain a thermoelectric relationship equation. In the embodiment, the thermoelectric relationship equation is a linear equation, and the straight line represented by the thermoelectric relationship equation is a skew line, as shown in FIG. 3. In FIG. 3, the ordinate axis represents the terminal voltage V, and the abscissa axis represents the difference $\Delta T$.

The electric potential equation of a thermoelectric material is expressed as:

$$V = S\Delta T' + IR \quad (1)$$

In foregoing expression (1), V is the terminal voltage of the thermoelectric module 100, S is a Seebeck coefficient of the thermoelectric module 100, and $\Delta T'$ is the average temperature difference at both ends of the thermoelectric pillars 150 (for example, an average temperature difference obtained by subtracting the average temperature of the end of the thermoelectric pillar 150 adjacent to the patterned conductive layer 130 from the average temperature of the end of the thermoelectric pillar 150 adjacent to the patterned conductive layer 140). Because the temperature difference of the thermoelectric module 100 is generated by the thermoelectric pillars 150 and because the cold side (i.e., the first substrate 110) of the thermoelectric module 100 contacts the heat insulator 260, the temperature difference $\Delta T$ between the hot side and the code side of the thermoelectric pillars 150 (i.e., the difference obtained by subtracting the temperature of the surface of the first substrate 110 facing the heat insulator 260 from the temperature of the surface of the second substrate 120 facing the temperature control element 270) is very close to the average temperature difference $\Delta T'$ at both ends of the thermoelectric pillars 150. Thus, $\Delta T'$ in foregoing expression (1) can be replaced by $\Delta T$ to obtain following expression (2):

$$V = S\Delta T + IR \quad (2)$$

Foregoing expression (2) is a theoretical linear equation related to the terminal voltage V and the difference $\Delta T$, and aforementioned thermoelectric relationship equation is a linear equation related to the terminal voltage V and the difference $\Delta T$ and obtained through linear regression and experimental data. Thus, the experimental thermoelectric relationship equation is close to the theoretical expression (2). Accordingly, the expression (2) can be considered the thermoelectric relationship equation.

Additionally, the processing unit 240 estimates at least one first parameter of the thermoelectric module 100 according to the thermoelectric relationship (i.e., the thermoelectric relationship equation). In the embodiment, the estimated first parameters include the Seebeck coefficient S of the thermoelectric module 100 and the internal resistance R of the thermoelectric module 100. In the embodiment, because the thermoelectric relationship equation (i.e., the expression (2)) is already obtained through linear regression, in the processing unit 240, the slope of the straight line represented by the thermoelectric relationship equation (i.e., the coefficient S before $\Delta T$ in foregoing expression (2)) is utilized to serve as the Seebeck coefficient S of the thermoelectric module 100.

Moreover in the processing unit 240 of the embodiment, a value obtained by dividing an intercept between the thermoelectric relationship equation and a coordinate axis (for example, the ordinate axis) by the value of the current is utilized to serve as the internal resistance R of the thermoelectric module 100. Herein the coordinate axis is the axis in the thermoelectric relationship equation that has the difference $\Delta T$ between the hot side temperature $T_h$ and the cold side temperature $T_c$ as zero. V=IR is obtained by bringing $\Delta T=0$ into foregoing expression (2) (i.e., IR is the intercept between the thermoelectric relationship equation and the axis having $\Delta T=0$ (i.e., the ordinate axis)). Because the current I is the current supplied by the power supply unit 210 and the value thereof is known, the internal resistance R of the thermoelectric module 100 can be calculated after dividing IR by the current I.

In the embodiment, the temperature measurement unit 230 measures the cold side temperature $T_c$ of the cold side during a second time after the first time, and the processing unit 240 estimates a second parameter according to the first parameters (for example, the Seebeck coefficient S and the internal resistance R) and the cold side temperatures $T_c$ measured during the second time. In the embodiment, the second time is a time after the difference $\Delta T$ between the hot side temperature $T_h$ of the hot side and the cold side temperature $T_c$ of the cold side in the thermoelectric module 100 substantially reaches its stability. For example, if the difference $\Delta T$ is stabilized within 20 seconds after the current I is first applied, the second time is the time after 20 seconds since the current I is first applied. For example, the cold side temperature $T_c$ is measured at a time point after the difference $\Delta T$ is stabilized (for example, at the $30^{th}$ second since the current I is first applied). Or, a plurality of cold side temperatures $T_c$ is respectively measured at a plurality of different time points since the difference $\Delta T$ is stabilized, and an average value of these cold side temperatures $T_c$ is then calculated to obtain an average cold side temperature $T_c$.

In the embodiment, the processing unit 240 estimates the thermal conductance K of the thermoelectric module 100 according to S, I, T$_c$, R, and ΔT. For example, the processing unit 240 calculates (SIT$_c$−I$^2$R/2)/ΔT to obtain the thermal conductance K of the thermoelectric module 100. Herein T$_c$ is brought in as an absolute temperature (i.e., a Kelvin temperature). The energy conservation equation of a thermoelectric material is as following expression (3):

$$Q_c = SIT'_c - \tfrac{1}{2}I^2R - K\Delta T' \quad (3)$$

In foregoing expression (3), Q$_c$ is the heat absorbed by the cold side of the thermoelectric pillars 150, and T'$_c$ is the temperature (an absolute temperature) of the cold side of the thermoelectric pillars 150 (i.e., the temperature at the end of the thermoelectric pillars 150 in FIG. 1 that is adjacent to the patterned conductive layer 130). Herein K is the overall thermal conductance K of the thermoelectric module 100. In addition, the physical meanings of S, I, R, and ΔT' can be understood by referring to foregoing description and will not be described herein. Because the heat insulator 260 is disposed on the cold side of the thermoelectric module 100, Q$_c$ is considered as 0, and T'$_c$ is close to the cold side temperature T$_c$ of the thermoelectric module 100 (i.e., the temperature of the surface of the first substrate 110 that faces the heat insulator 260). Following expression (4) can be obtained by respectively bringing 0, T$_c$, and ΔT into foregoing expression (3) as Q$_c$, T'$_c$, and ΔT':

$$K = \frac{1}{\Delta T}\left(SIT_c - \frac{1}{2}I^2R\right) \quad (4)$$

Based on the expression (4), the thermal conductance K of the thermoelectric module 100 can be obtained by calculating (SIT$_c$−I$^2$R/2)/ΔT.

The measurement apparatus 200 in the embodiment obtains the Seebeck coefficient S and the internal resistance R of the thermoelectric module 100 by using the temporary relationship between the temperature difference (i.e., ΔT) between the hot side and the cold side of the thermoelectric module 100 and the corresponding terminal voltage V short after the current I is applied to the thermoelectric module 100. Thus, the measurement apparatus 200 in the embodiment can measure overall thermoelectric parameters (for example, the Seebeck coefficient S and the internal resistance R) of the thermoelectric module 100 in a short time. Compared to the conventional technique (in which the overall thermoelectric properties of a thermoelectric module cannot be estimated based on the thermoelectric properties of the thermoelectric pillars), the measurement apparatus 200 in the embodiment can measure the overall thermoelectric parameters of the thermoelectric module 100 and therefore can evaluate the actual overall thermoelectric properties of the thermoelectric module 100. Accordingly, the measurement apparatus 200 in the embodiment allows a user to accurately evaluate the thermoelectric characteristic and thermoelectric efficiency of the thermoelectric module 100.

Additionally, when the difference ΔT is substantially stabilized, the measurement apparatus 200 in the embodiment can calculate the overall thermal conductance K of the thermoelectric module 100 by measuring the cold side temperature T$_c$. Thus, the measurement apparatus 200 in the embodiment can measure various thermoelectric parameters (for example, the thermoelectric parameters S, R, and K) of the thermoelectric module 100 in a short time (for example, within 1 minute). Because the thermoelectric parameters S, R, and K of the thermoelectric module 100 can be measured, the performance of the thermoelectric module 100 can be accurately evaluated.

Additionally, the average Seebeck coefficient S$_{avg}$, the average resistivity ρ, and the average thermal conductivity k of each thermoelectric pillar 150 of the thermoelectric module 100 and the overall Seebeck coefficient S, the overall internal resistance R, and the overall thermal conductance K of the thermoelectric module 100 respectively satisfy following expressions (5), (6), and (7):

$$S_{avg} = \frac{S}{2M} \quad (5)$$

$$\rho = R\frac{A}{2M \times h} \quad (6)$$

$$k = K\frac{h}{2M \times A} \quad (7)$$

In foregoing expressions, A is the sectional area of a single thermoelectric pillar 150 in the direction substantially perpendicular to the direction of the passing current I (i.e., the sectional area of the thermoelectric pillar 150 in FIG. 1 in the horizontal direction), and h is the height of the thermoelectric pillar 150 in the direction substantially parallel to the direction of the passing current I (i.e., the vertical height of the thermoelectric pillar 150 in FIG. 1, or the distance from the patterned conductive layer 130 to the patterned conductive layer 140).

Thereby, in the embodiment, the processing unit 240 divides the Seebeck coefficient S of the thermoelectric module 100 by 2M (i.e., calculates S/2M) to obtain the average Seebeck coefficient S$_{avg}$ of each thermoelectric pillar 150. In addition, the processing unit 240 multiplies the internal resistance R of the thermoelectric module 100 by A, and divides by the product of h and 2M (i.e., calculates (RA)/(2Mh)) to obtain the resistivity ρ of each thermoelectric pillar 150. Moreover, the processing unit 240 multiplies the thermal conductance K of the thermoelectric module 100 by h and divides by the product of A and 2M (i.e., calculates (Kh)/(2MA)) to obtain the average thermal conductivity k of each thermoelectric pillar 150. After obtaining the parameters S$_{avg}$, ρ, and k, the measurement apparatus 200 in the embodiment brings these three parameters into a figure of merit equation to evaluate the performance of the thermoelectric module 100.

The measurement method illustrated in FIG. 2 can be applied to the measurement apparatus 200 in FIG. 1 for measuring the thermoelectric module 100. For example, the measurement apparatus 200 further includes a computer readable medium 250 for storing a computer program product. When instructions in the computer program product are loaded into the processing unit 240, the measurement method in the embodiment can be realized through the processing unit 240. The computer readable medium 250 may be a hard drive, a floppy drive, a memory card, a flash drive, a firmware, an optical disc, a read only memory (ROM), a random access memory (RAM), or any other recording medium capable of storing instructions (or program codes). The measurement method in the embodiment includes following steps. First, in step S110, a temperature is provided to the thermoelectric module 100. Step S110 can be accomplished by first instructions in the computer program product executed by the processing unit 240. For example, the processing unit 240 requests the temperature control element 270 to provide the temperature to the thermoelectric module 100. Then, in step S120, a current I is applied to the thermoelectric module 100 to turn both sides of the thermoelectric module 100 respectively into a hot side and a cold side. Step S120 can be accomplished by second instructions in the computer program product executed by the processing unit 240. Next, in step S130, a terminal voltage V of the thermoelectric module 100, a hot side temperature $T_h$ of the hot side, and a cold side temperature $T_c$ of the cold side are measured at each of a plurality of time points during a first time. Step S130 can be accomplished by third instructions in the computer program product executed by the processing unit 240. For example, the processing unit 240 requests the voltage measurement unit 220 to measure the terminal voltage V and requests the temperature measurement unit 230 to measure the hot side temperature $T_h$ and the cold side temperature $T_c$.

Thereafter, in step S140, a plurality of differences $\Delta T$ between the hot side temperatures $T_h$ and the corresponding cold side temperatures $T_c$ is calculated according to the terminal voltages V, the hot side temperatures $T_h$, and the cold side temperatures $T_c$ measured at the time points during the first time to obtain a thermoelectric relationship between the terminal voltages V and the differences $\Delta T$. Step S140 can be accomplished by fourth instructions in the computer program product executed by the processing unit 240.

In step S150, at least one first parameter (for example, a Seebeck coefficient S and an internal resistance R) of the thermoelectric module 100 is estimated according to the thermoelectric relationship. Step S150 can be accomplished by fifth instructions in the computer program product executed by the processing unit 240.

In the embodiment, after step S150, the measurement method also includes a step of dividing the Seebeck coefficient S of the thermoelectric module 100 by 2M (i.e., calculating S/2M) to obtain an average Seebeck coefficient $S_{avg}$ of each thermoelectric pillar 150. This step can be accomplished by sixth instructions in the computer program product executed by the processing unit 240. Moreover, the measurement method also includes a step of multiplying the internal resistance R of the thermoelectric module 100 and dividing by the product of h and 2M (i.e., calculating (RA)/(2Mh)) to obtain the resistivity p of each thermoelectric pillar 150. This step can be accomplished by seventh instructions in the computer program product executed by the processing unit 240.

Thereafter, in step S160, the cold side temperature $T_c$ is measured during a second time after the first time. Step S160 can be accomplished by eighth instructions in the computer program product executed by the processing unit 240 and by requesting the temperature measurement unit 230 to measure the cold side temperature L.

Next, in step S170, a second parameter (for example, the thermal conductance K) is estimated according to the first parameter (for example, the Seebeck coefficient S and the internal resistance R) and the cold side temperature $T_c$ measured during the second time. Step S170 can be accomplished by ninth instructions in the computer program product executed by the processing unit 240.

Moreover, the measurement method in the embodiment may include a step of multiplying the thermal conductance K of the thermoelectric module 100 by h and dividing by the product of A and 2M (i.e., calculating (Kh)/(2MA)) to obtain the thermal conductivity k of each thermoelectric pillar 150. This step can be accomplished by tenth instructions in the computer program product executed by the processing unit 240.

In another embodiment, the sixth instructions and the seventh instructions and the corresponding steps may also be executed after the step S160 or after the step S170, and execution sequence of the sixth instructions, the seventh instructions, and the tenth instructions and the corresponding steps can be changed to any sequence.

The details of other steps in the measurement method and the details of the instructions in the computer program product can be understood by referring to foregoing description related to the operations of the measurement apparatus 200 and will not be described herein. In addition, the measurement method and the computer program product in the embodiment can also accomplish the function of the measurement apparatus 200 described above, which will not be further described herein.

The measurement apparatus 200, the measurement method, and the computer program product in the embodiment are described by taking computer-automated measurement as an example. However, the disclosure is not limited thereto, and in other embodiments, the measurement apparatus 200 and the measurement method may also be implemented by adopting semi-automated measurement or even manual measurement.

Figure 4:
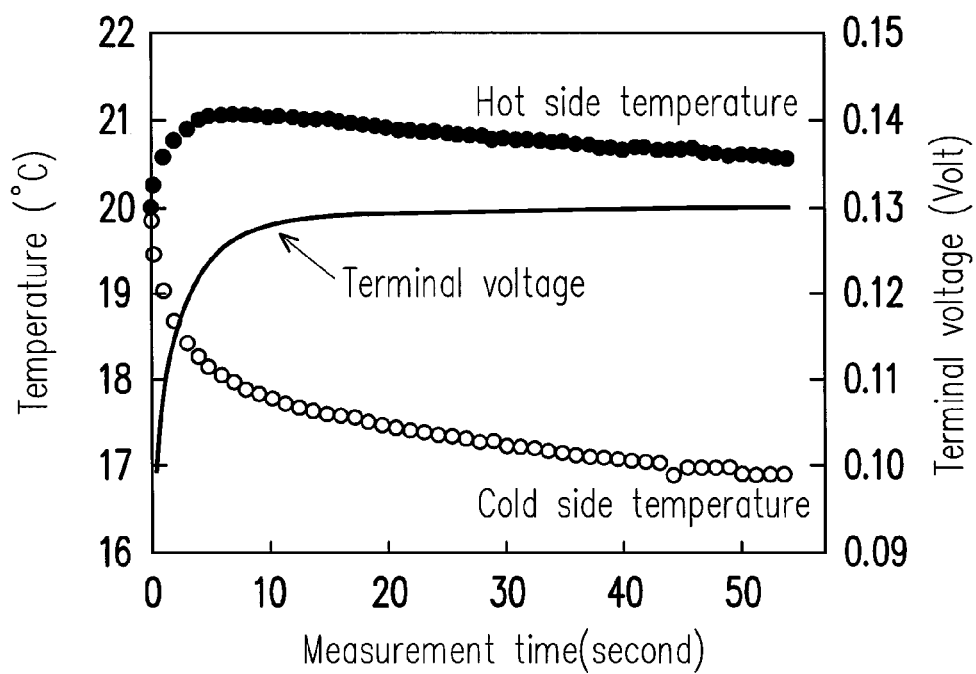
FIG. 4 illustrates how a hot side temperature, a cold side temperature, and a terminal voltage of a thermoelectric module change with time when the measurement apparatus in FIG. 1 measures the thermoelectric module.
Figure 5:
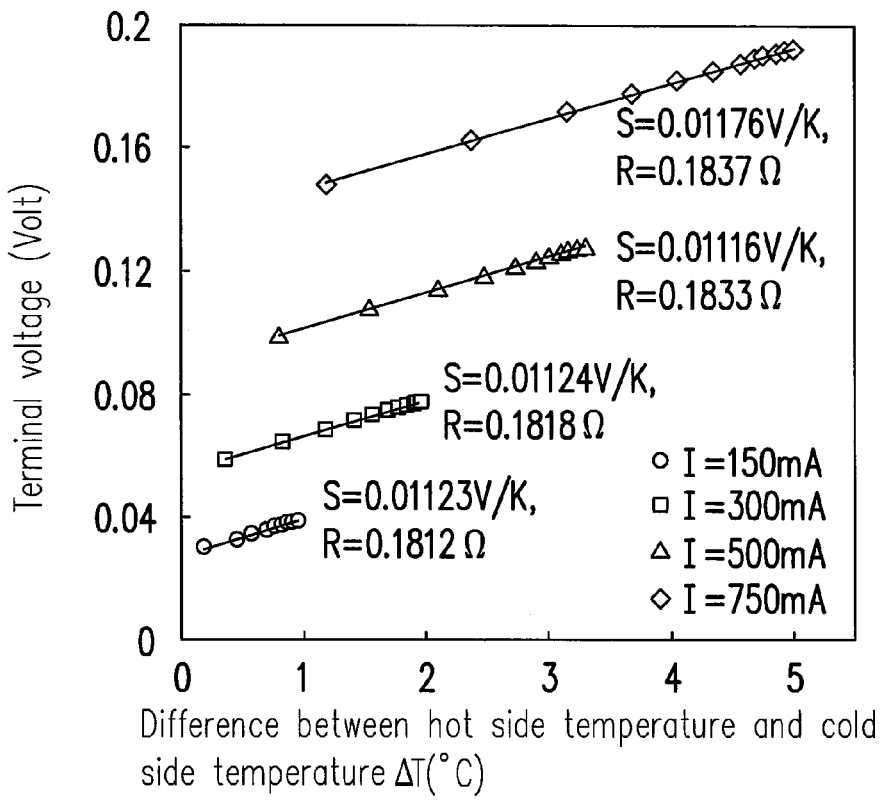
FIG. 5 illustrates how a terminal voltage of a thermoelectric module changes with a difference between a hot side temperature and a cold side temperature when the measurement apparatus in FIG. 1 measures the thermoelectric module.
Figure 6:
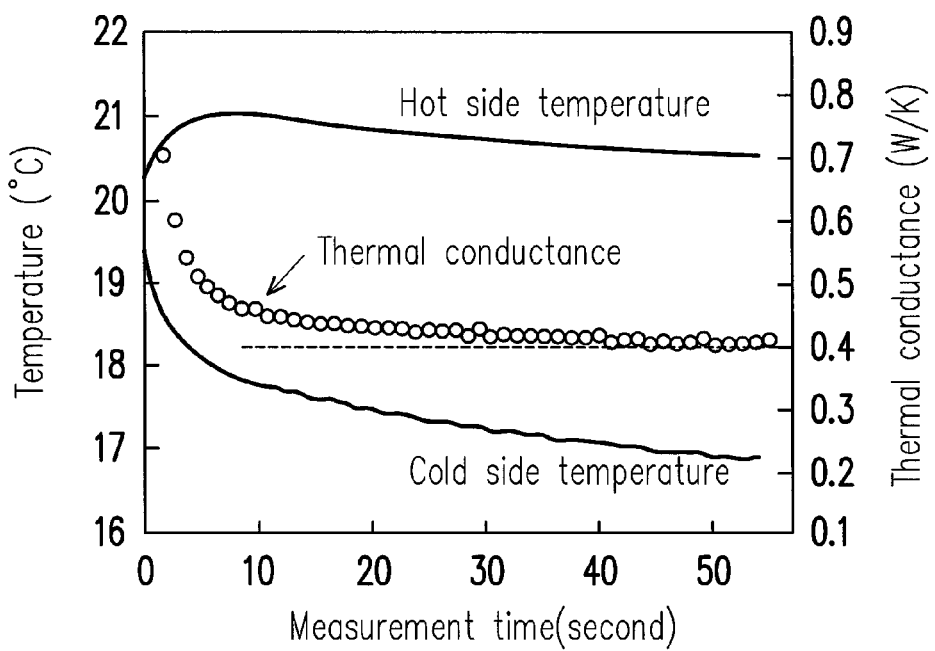
FIG. 6 illustrates how a hot side temperature, a cold side temperature, and a thermal conductance change with time when the measurement apparatus in FIG. 1 measures the thermoelectric module.

FIG. 4 illustrates how the hot side temperature, the cold side temperature, and the terminal voltage of a thermoelectric module change with time when the measurement apparatus in FIG. 1 measures the thermoelectric module. FIG. 5 illustrates how the terminal voltage of the thermoelectric module changes with the difference between the hot side temperature and the cold side temperature when the measurement apparatus in FIG. 1 measures the thermoelectric module. FIG. 6 illustrates how the hot side temperature, the cold side temperature, and the thermal conductance change with time when the measurement apparatus in FIG. 1 measures the thermoelectric module. As shown in FIG. 4, the difference $\Delta T$ between the hot side temperature $T_h$ and the cold side temperature $T_c$ stabilizes after some time (for example, 20 seconds). Thus, the Seebeck coefficient S and the internal resistance R of the thermoelectric module 100 can be calculated during this time, and the thermal conductance of the thermoelectric module 100 can be calculated after this time. As shown in FIG. 5, when a current I of different value (for example, 150 mA, 300 mA, 500 mA, and 750 mA) is applied to the thermoelectric module 100, the terminal voltage V and the difference $\Delta T$ between the hot side temperature and the cold side temperature always presents a linear thermoelectric relationship. In addition, under different current conditions, the Seebeck coefficient S of the thermoelectric module 100 and the internal resistance R of the thermoelectric module 100 obtained based on the linear thermoelectric relationship are approximately the same. Thereby, the measurement apparatus 200 and the measurement method in the embodiment offer high data stability. As shown in FIG. 6, the thermal conductance K of the thermoelectric module 100 stabilizes after some time (for example, 30 seconds) since the measurement starts (i.e., since the current I is first applied). Thus, the time point for measuring the cold side temperature $T_c$, so as to calculate the thermal conductance K of the thermoelectric module 100, can be after 30 seconds since the current I is first applied. In addition, because the thermal conductance K does not change much after 30 seconds, the time point for measuring the cold side temperature $T_c$, so as to calculate the thermal conductance K of the thermoelectric module 100, can be set to be within one minute since the current I is first applied. In other words, the measurement apparatus 200 and the measurement method in the embodiment can measure all the thermoelectric parameters mentioned above within one minute. Thus, quick measurement can be accomplished by the measurement apparatus 200 and the measurement method in the embodiment.

Figure 7:
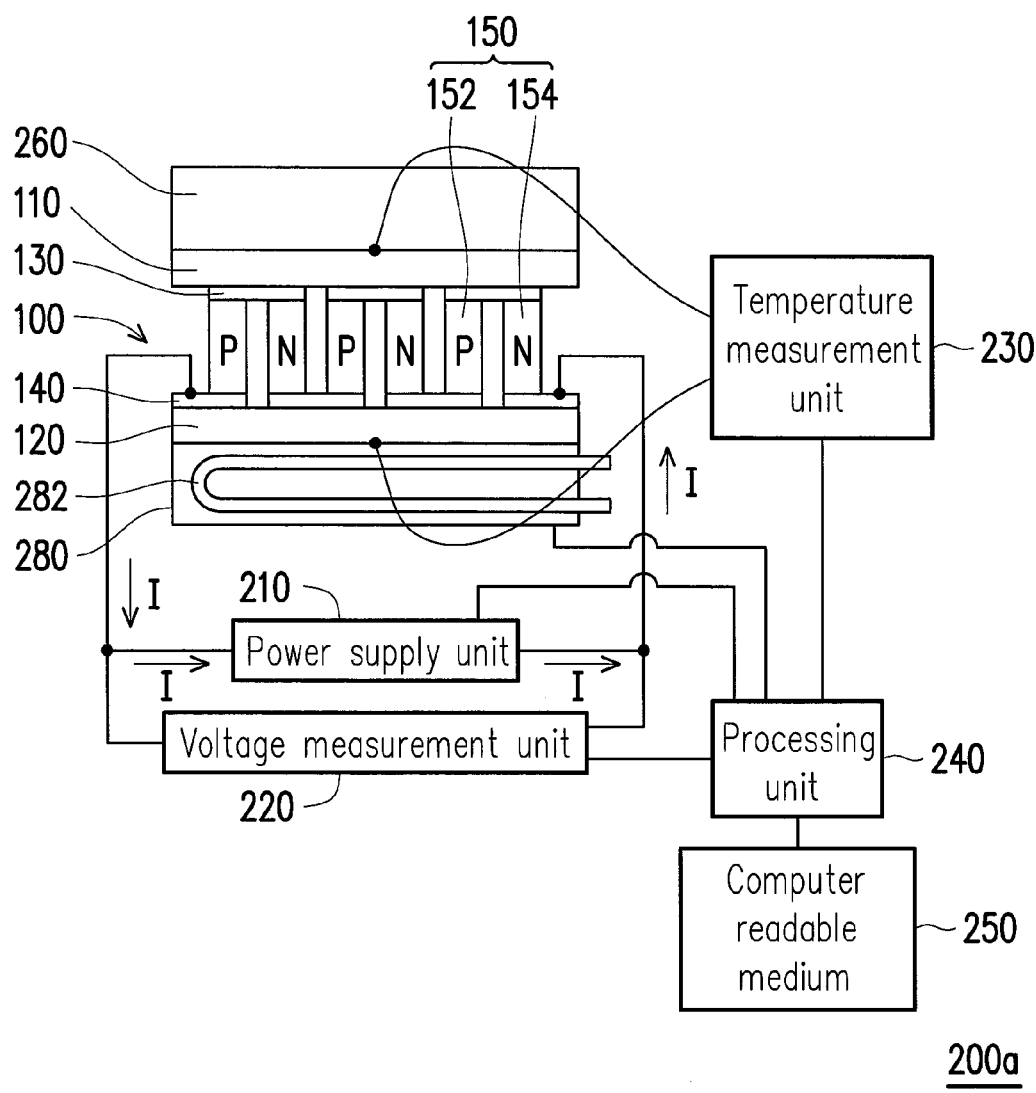
FIG. 7 is a diagram of a measurement apparatus according to another embodiment of the disclosure.

FIG. 7 is a diagram of a measurement apparatus according to another embodiment of the disclosure. Referring to FIG. 7, the measurement apparatus 200a in the embodiment is similar to the measurement apparatus 200 in FIG. 1, and the difference between the two measurement apparatuses is that in the embodiment, the temperature control element 280 is a cold plate, the cold plate has a flow channel 282, and the flow channel 282 contains a fluid. The fluid may be water, acetone, refrigerant, liquid nitrogen, or any other fluid that can carry and conduct heat. Moreover, in the embodiment, the processing unit 240 can load the instructions of a computer program product to control the temperature control element 280.

Figure 8:
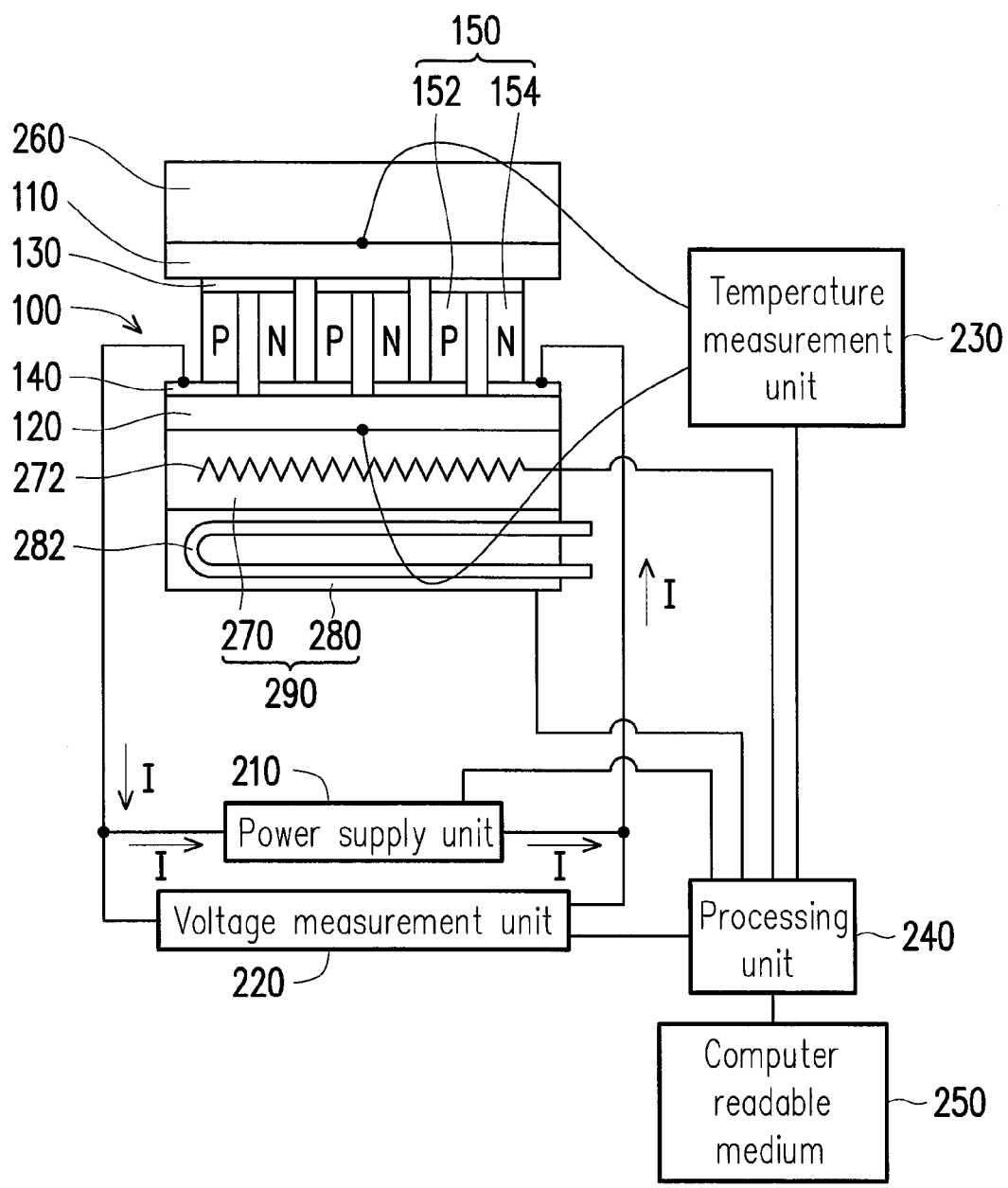
FIG. 8 is a diagram of a measurement apparatus according to yet another embodiment of the disclosure.

FIG. 8 is a diagram of a measurement apparatus according to yet another embodiment of the disclosure. Referring to FIG. 8, the measurement apparatus 200b in the embodiment is similar to the measurement apparatus 200 in FIG. 1. The difference between the two measurement apparatuses is that in the embodiment, the temperature control element 290 includes both the temperature control element 270 (i.e., the hot plate) in FIG. 1 and the temperature control element 280 (i.e., the cold plate) in FIG. 8 (i.e., the temperature control element 290 is a combination of a hot plate and a cold plate). Thus, the temperature control element 290 can regulate the temperature of the thermoelectric module 100 in a more stable way, and the temperature control element 290 can control the temperature of the thermoelectric module 100 to be within more different temperature ranges.

Figure 9:
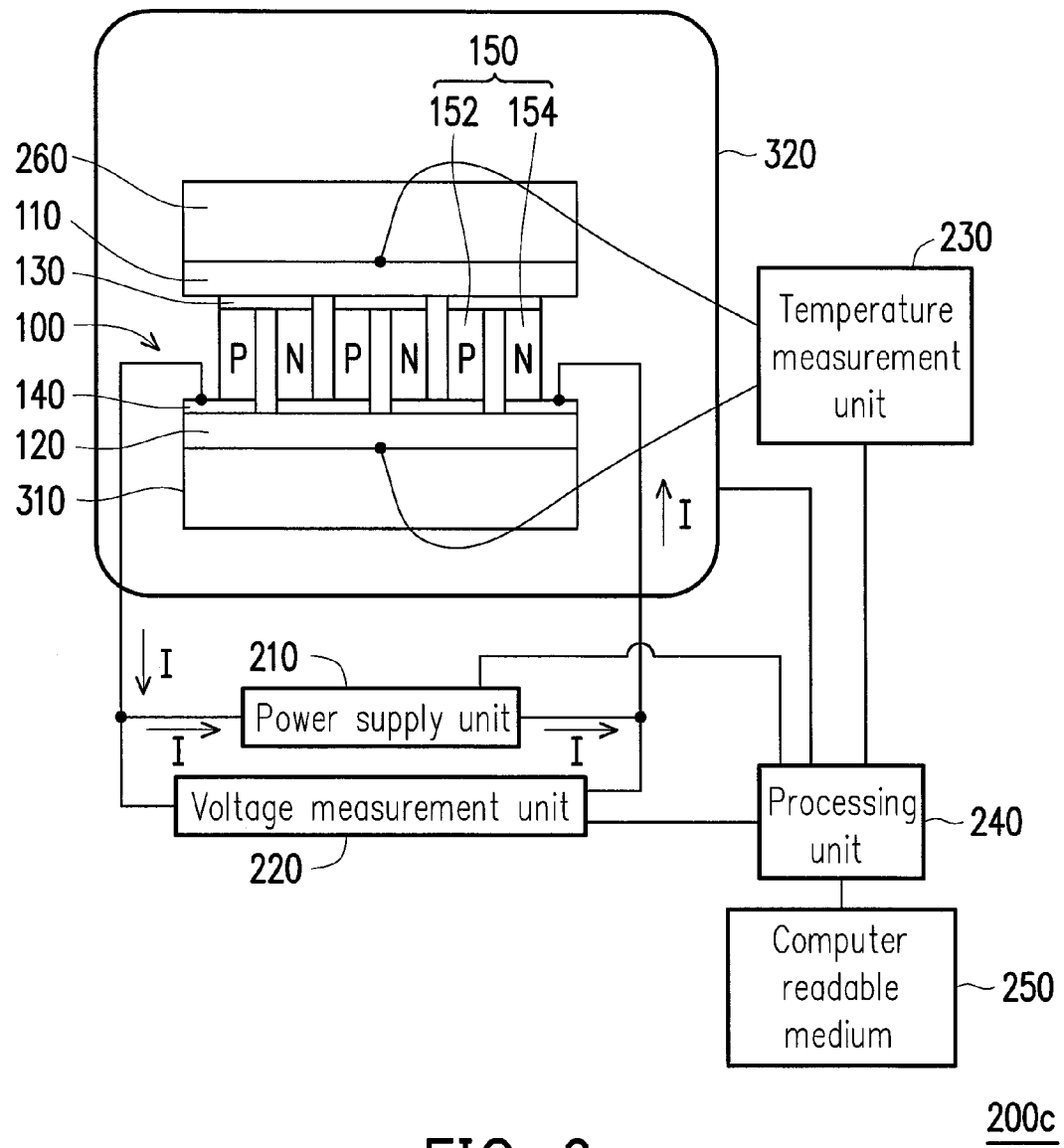
FIG. 9 is a diagram of a measurement apparatus according to still another embodiment of the disclosure.

FIG. 9 is a diagram of a measurement apparatus according to still another embodiment of the disclosure. Referring to FIG. 9, the measurement apparatus 200c in the embodiment is similar to the measurement apparatus 200 in FIG. 1. The difference between the two measurement apparatuses will be described below. In the measurement apparatus 200c of the embodiment, a heat insulator 310 is disposed on the hot side (i.e., the second substrate 120) of the thermoelectric module 100. Besides, the measurement apparatus 200c further includes a constant temperature cabinet 320, and the thermoelectric module 100 and the heat insulators 260 and 310 are placed in the constant temperature cabinet 320. The constant temperature cabinet 320 provides a stable ambient temperature to the thermoelectric module 100. In other words, in the measurement method of the embodiment, the thermoelectric module 100 and the heat insulators 260 and 310 are placed into a stable ambient temperature, and the processing unit 240 can load the instructions of a computer program product to control the constant temperature cabinet 320.

In another embodiment, the thermoelectric module 100 and the heat insulators 260 and 310 may also be placed in room temperature instead of in the constant temperature cabinet 320. Because the temperature in an indoor space does not change too much in a short time (for example, during the one minute time for the measurement apparatus 200 to perform measurement), the room temperature can be considered a stable ambient temperature. Thus, an accurate measurement can be accomplished by placing the thermoelectric module 100 and the heat insulators 260 and 310 in an indoor space.

Figure 10:
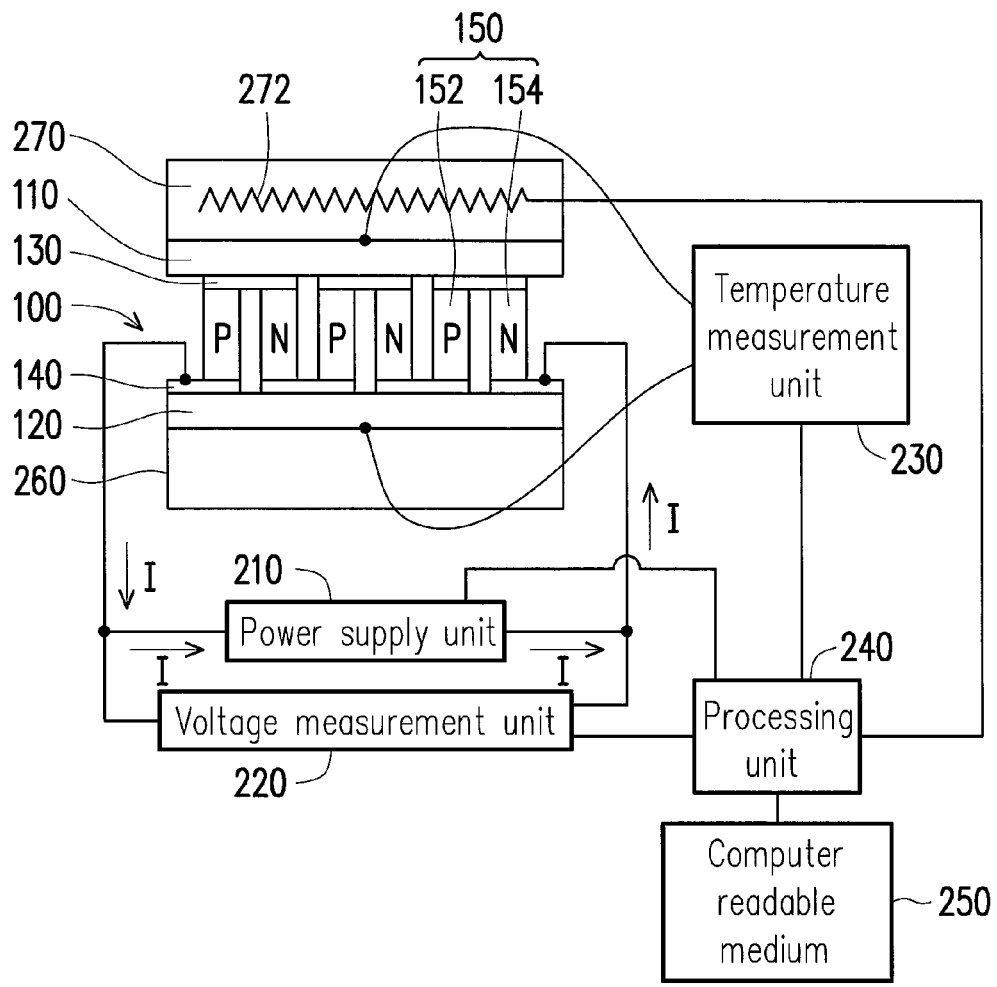
FIG. 10 is a diagram of a measurement apparatus according to yet still another embodiment of the disclosure.
Figure 11:
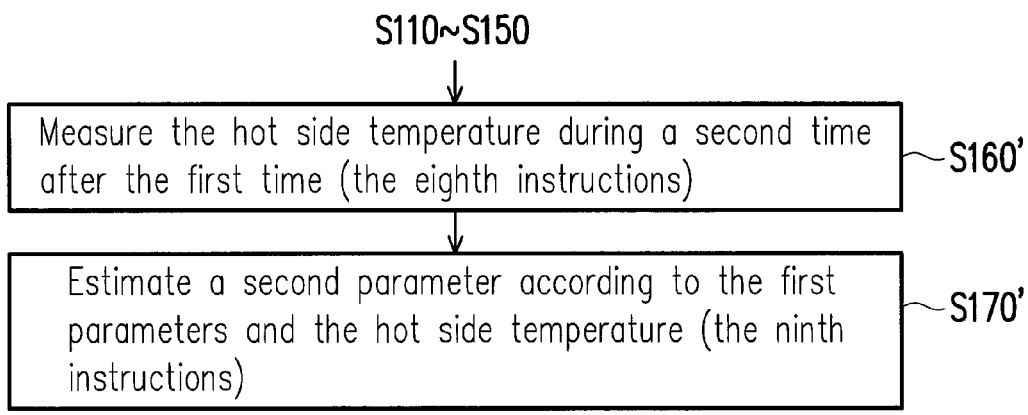
FIG. 11 is a flowchart of a measurement method adapted to the measurement apparatus in FIG. 10.

FIG. 10 is a diagram of a measurement apparatus according to yet still another embodiment of the disclosure, and FIG. 11 is a flowchart of a measurement method adapted to the measurement apparatus in FIG. 10. Referring to FIG. 10 and FIG. 11, the measurement apparatus 200d in the embodiment is similar to the measurement apparatus 200 in FIG. 1, and the difference between the two measurement apparatuses will be described below. In FIG. 1, the temperature control element 270 is disposed on the hot side (i.e., the second substrate 120), and the heat insulator 260 is disposed on the cold side (i.e., the first substrate 110). However, in the measurement apparatus 200d of the embodiment, the temperature control element 270 is disposed on the cold side (i.e., the first substrate 110), and the heat insulator 260 is disposed on the hot side (i.e., the second substrate 120). In the embodiment, after the positions of the devices are exchanged as mentioned above, the original measurement method can be adopted to measure the parameters S, $S_{avg}$, R, and ρ, but the adjustment described below can be performed to measure the parameters K and k.

In the embodiment, the temperature measurement unit 230 measures the hot side temperature $T_h$ of the hot side during the second time after the first time, and the processing unit 240 estimates the second parameter according to the first parameters (for example, the Seebeck coefficient S and the internal resistance R) and the hot side temperature $T_h$. Besides, in the embodiment, the processing unit 240 estimates the thermal conductance K of the thermoelectric module 100 according to S, I, $T_c$, R, and ΔT. For example, the processing unit 240 calculates $(SIT_h+I^2R/2)/\Delta T$ to obtain the thermal conductance K of the thermoelectric module 100. Herein the hot side temperature $T_h$ is brought in as an absolute temperature (i.e., a Kelvin temperature). The processing unit 240 calculates (Kh)/(2MA) to obtain the average thermal conductivity k of each thermoelectric pillar 150.

In the measurement method of the embodiment, steps S110-S150 are the same as the measurement method in FIG. 2. In step S160', the hot side temperature $T_h$ is measured during the second time after the first time. Step S160' can be accomplished through the eighth instructions of the computer program product executed by the processing unit 240 by requesting the temperature measurement unit 230 to measure the hot side temperature $T_h$. Next, in step S170', the second parameter (for example, the thermal conductance K) is estimated according to the first parameters (for example, the Seebeck coefficient S and the internal resistance R) and the hot side temperature $T_h$. Step S170' can be accomplished through the ninth instructions of the computer program product executed by the processing unit 240.

Steps and other details of the measurement method and other details of the instructions of the computer program product in the embodiment can be understood by referring to foregoing descriptions related to the operations of the measurement apparatus 200d therefore will not be described herein.

In other embodiments, the temperature control element 270 (i.e., a hot plate) disposed on the cold side (i.e., the first substrate 110) may also be replaced by the temperature control element 280 (i.e., a cold plate) in FIG. 7 or the temperature control element 290 (i.e., a combination of cold plate and hot plate) in FIG. 8.

As described above, in a measurement apparatus, a measurement method, and a computer program product provided by embodiments of the disclosure, a Seebeck coefficient and an internal resistance of a thermoelectric module are obtained according to a temporary relationship between a temperature difference between a hot side and a cold side of the thermoelectric module and a corresponding terminal voltage shortly after a current is applied to the thermoelectric module. Thus, the measurement apparatus, the measurement method, and the computer program product in embodiments of the disclosure can measure the overall thermoelectric parameters (for example, a Seebeck coefficient and an internal resistance) of a thermoelectric module in a short time. Compared to the conventional technique (in which the overall thermoelectric properties of a thermoelectric module cannot be evaluated based on the thermoelectric properties of the thermoelectric pillars), the measurement apparatus, the measurement method, and the computer program product in embodiments of the disclosure can directly measure the overall thermoelectric parameter of a thermoelectric module and therefore can evaluate the actual overall thermoelectric properties of the thermoelectric module. Thereby, the thermoelectric characteristic and thermoelectric efficiency of the thermoelectric module can be accurately evaluated.

Moreover, when the difference between the hot side temperature and the cold side temperature is substantially stabilized, the measurement apparatus, the measurement method, and the computer program product in embodiments of the disclosure can calculate the overall thermal conductance of a thermoelectric module by measuring the cold side temperature or the hot side temperature. Thus, the measurement apparatus, the measurement method, and the computer program product in embodiments of the disclosure can measure various thermoelectric parameters (for example, a Seebeck coefficient, an internal resistance, and a thermal conductance) of a thermoelectric module in a short time (for example, within one minute). Because the Seebeck coefficient, the internal resistance, and the thermal conductance of the thermoelectric module can all be measured, the performance of the thermoelectric module can be accurately evaluated.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A measurement method, for measuring a thermoelectric module, the measurement method comprising:
    providing a temperature to the thermoelectric module;
    applying a current to the thermoelectric module to turn both sides of the thermoelectric module respectively into a hot side and a cold side, wherein temperature of the hot side is higher than temperature of the cold side;
    measuring a terminal voltage of the thermoelectric module, a hot side temperature of the hot side, and a cold side temperature of the cold side at each of a plurality of time points during a first time;
    calculating a plurality of differences between the hot side temperatures and the corresponding cold side temperatures according to the terminal voltages, the hot side temperatures and the cold side temperatures measured at the time points during the first time to obtain a thermoelectric relationship between the terminal voltages and the differences;
    estimating at least one first parameter of the thermoelectric module according to the thermoelectric relationship; and
    measuring the cold side temperature of the cold side or the hot side temperature of the hot side during a second time after the first time and estimating a second parameter according to the at least one first parameter and the cold side temperature or the hot side temperature measured during the second time.

2. The measurement method according to claim 1, wherein the step of obtaining the thermoelectric relationship comprises:
    performing a linear regression according to the ten al voltages measured at the time points during the first time and the differences corresponding to the terminal voltages to obtain a thermoelectric relationship equation.

3. The measurement method according to claim 2, wherein the step of estimating the at least one first parameter of the thermoelectric module according to the thermoelectric relationship comprises:
    utilizing a slope of a straight line represented by the thermoelectric relationship equation to serve as a Seebeck coefficient of the thermoelectric module.

4. The measurement method according to claim 3, wherein the thermoelectric module comprises a first substrate, a second substrate, and M pairs of thermoelectric pillars electrically connected with each other, wherein M is a positive integer, each pair of the thermoelectric pillars connects the first substrate and the second substrate, and the measurement method further comprises:
    dividing the Seebeck coefficient of the thermoelectric module by 2M to obtain an average Seebeck coefficient of each of the thermoelectric pillars.

5. The measurement method according to claim 2, wherein the step of estimating the at least one first parameter of the thermoelectric module according to the thermoelectric relationship comprises:
    utilizing a first value obtained by dividing value of the current into an intercept between the thermoelectric relationship equation and a coordinate axis to serve as an internal resistance of the thermoelectric module, wherein the coordinate axis is an axis having the difference between the hot side temperature and the cold side temperature as zero in the thermoelectric relationship equation.

6. The measurement method according to claim 5, wherein the thermoelectric module comprises a first substrate, a second substrate, and M pairs of thermoelectric pillars electrically connected with each other, wherein M is a positive integer, each pair of the thermoelectric pillars connects the first substrate and the second substrate, and the measurement method further comprises:
    multiplying the internal resistance of the thermoelectric module by A, and divided by product of h and 2M to obtain a resistivity of each of the thermoelectric pillars, wherein A is a sectional area of one of the thermoelectric pillars in a first direction substantially perpendicular to a direction of the current, and h is a height of the thermoelectric pillar in a second direction substantially parallel to the direction of the current.

7. The measurement method according to claim 1, wherein a difference between the hot side temperature and the corresponding cold side temperature measured during the second time, the cold side temperature, and the hot side temperature are respectively $\Delta T$, $T_c$, and $T_h$, the current is I, wherein the step of obtaining the thermoelectric relationship comprises:
    performing a linear regression according to the terminal voltages measured at the time points during the first time and the differences corresponding to the terminal voltages to obtain the thermoelectric relationship equation;
    wherein the step of estimating the at least one first parameter of the thermoelectric module according to the thermoelectric relationship equation comprises:

utilizing a slope of a straight line represented by the thermoelectric relationship equation to serve as a Seebeck coefficient S of the thermoelectric module; and utilizing a second value obtained by dividing value of the current into an intercept between the thermoelectric relationship equation and a coordinate axis to serve as an internal resistance R of the thermoelectric module, wherein the coordinate axis is an axis having the difference between the hot side temperature and the cold side temperature as zero in the thermoelectric relationship equation;

wherein the step of estimating the second parameter according to the at least one first parameter and the cold side temperature or the hot side temperature measured during the second time comprises:

estimating a thermal conductance of the thermoelectric module according to S, I, $T_c$, R, and $\Delta T$ or according to S, I, $T_h$, R, and $\Delta T$.

8. The measurement method according to claim 7, wherein the step of providing the temperature to the thermoelectric module comprises:

disposing a heat insulator on the cold side; and
disposing a temperature control element on the hot side to regulate the temperature of the hot side;
wherein the step of estimating the thermal conductance of the thermoelectric module according to S, I, $T_c$, R, and $\Delta T$ or according to S, I, $T_h$, R, and $\Delta T$ comprises:
calculating $(SIT_c - I^2R/2)/\Delta T$ to obtain the thermal conductance of the thermoelectric module.

9. The measurement method according to claim 7, wherein the step of providing the temperature to the thermoelectric module comprises:

disposing a temperature control element on the cold side to regulate the temperature of the cold side; and
disposing a heat insulator on the hot side;
wherein the step of estimating the thermal conductance of the thermoelectric module according to S, I, $T_c$, R, and $\Delta T$ or according to S, I, $T_h$, R, and $\Delta T$ comprises:
calculating $(SIT_h - I^2R/2)/\Delta T$ to obtain the thermal conductance of the thermoelectric module.

10. The measurement method according to claim 7, wherein the thermoelectric module comprises a first substrate, a second substrate, and M pairs of thermoelectric pillars electrically connected with each other, wherein M is a positive integer, each pair of the thermoelectric pillars connects the first substrate and the second substrate, and the measurement method further comprises:

multiplying the thermal conductance of the thermoelectric module by h, and divided by product of A and 2M to obtain a thermal conductivity of each of the thermoelectric pillars, wherein A is a sectional area of one of the thermoelectric pillars in a third direction substantially perpendicular to a direction of the current, and h is a height of the thermoelectric pillar in a fourth direction substantially parallel to the direction of the current.

11. The measurement method according to claim 1, wherein the step of providing the temperature to the thermoelectric module comprises:

disposing a heat insulator on the cold side; and
disposing a temperature control element on the hot side to regulate the temperature of the hot side.

12. The measurement method according to claim 11, wherein the temperature control element comprises one or a combination of a cold plate with a flow channel containing a fluid and a hot plate with a heating unit.

13. The measurement method according to claim 1, wherein the step of providing the temperature to the thermoelectric module comprises:

disposing a temperature control element on the cold side to regulate the temperature of the cold side; and
disposing a heat insulator on the hot side.

14. The measurement method according to claim 13, wherein the temperature control element comprises one or a combination of a cold plate with a flow channel containing a fluid and a hot plate with a heating unit.

15. The measurement method according to claim 1, wherein the step of providing the temperature to the thermoelectric module comprises:

disposing a heat insulator on each of the hot side and the cold side; and
placing the thermoelectric module and the heat insulators into a stable ambient temperature.

16. The measurement method according to claim 15, wherein the step of placing the thermoelectric module and the heat insulators into the stable ambient temperature comprises:

placing the thermoelectric module and the heat insulators into a constant temperature cabinet.

17. The measurement method according to claim 1, wherein the current is substantially a constant current.

18. A measurement apparatus, configured to measure a thermoelectric module, the measurement apparatus comprising:

a power supply unit, applying a current to the thermoelectric module to turn both sides of the thermoelectric module respectively into a hot side and a cold side, wherein temperature of the hot side is higher than temperature of the cold side;

a voltage measurement unit, measuring a terminal voltage of the thermoelectric module at each of a plurality of time points during a first time;

a temperature measurement unit, measuring a hot side temperature of the hot side and a cold side temperature of the cold side at each of the time points during the first time; and a processing unit, calculating a plurality of differences between the hot side temperatures and the corresponding cold side temperatures according to the terminal voltages, the hot side temperatures, and the cold side temperatures measured at the time points during the first time to obtain a thermoelectric relationship between the terminal voltages and the differences, and estimating at least one first parameter of the thermoelectric module according to the thermoelectric relationship, wherein the temperature measurement unit measures the cold side temperature of the cold side or the hot side temperature of the hot side during a second time after the first time, and the processing unit estimates a second parameter according to the at least one first parameter and according to the cold side temperature or the hot side temperature measured during the second time.

19. The measurement apparatus according to claim 18, wherein the processing unit performs a linear regression according to the terminal voltages measured at the time points during the first time and the differences corresponding to the terminal voltages to obtain a thermoelectric relationship equation.

20. The measurement apparatus according to claim 19, wherein the processing unit serves a slope of a straight line represented by the thermoelectric relationship equation as a Seebeck coefficient of the thermoelectric module.

21. The measurement apparatus according to claim 20, wherein the thermoelectric module comprises a first substrate, a second substrate, and M pairs of thermoelectric pillars electrically connected with each other, wherein M is a positive integer, each pair of the thermoelectric pillars connects the first substrate and the second substrate, and the processing unit divides the Seebeck coefficient of the thermoelectric module by 2M to obtain an average Seebeck coefficient of each of the thermoelectric pillars.

22. The measurement apparatus according to claim 19, wherein the processing unit serves a first value obtained by dividing value of the current into an intercept between the thermoelectric relationship equation and a coordinate axis as an internal resistance of the thermoelectric module, wherein the coordinate axis is an axis having the difference between the hot side temperature and the cold side temperature as zero in the thermoelectric relationship equation.

23. The measurement apparatus according to claim 22, wherein the thermoelectric module comprises a first substrate, a second substrate, and M pairs of thermoelectric pillars electrically connected with each other, wherein M is a positive integer, each pair of the thermoelectric pillars connects the first substrate and the second substrate, and the processing unit multiplies the internal resistance of the thermoelectric module by A and divided by product of h and 2M to obtain a resistivity of each of the thermoelectric pillars, wherein A is a sectional area of one of the thermoelectric pillars in a first direction substantially perpendicular to a direction of the current, and h is a height of the thermoelectric pillar in a second direction substantially parallel to the direction of the current.

24. The measurement apparatus according to claim 18, wherein a difference between the hot side temperature and the corresponding cold side temperature measured during the second time, the cold side temperature, and the hot side temperature are respectively $\Delta T$, $T_c$, and $T_h$, the current is I, the processing unit performs a linear regression according to the terminal voltages measured at the time points during the first time and the differences corresponding to the terminal voltages to obtain the thermoelectric relationship equation, the processing unit serves a slope of a straight line represented by the thermoelectric relationship equation as a Seebeck coefficient S of the thermoelectric module and serves a second value obtained by dividing value of the current into an intercept between the thermoelectric relationship equation and a coordinate axis as an internal resistance R of the thermoelectric module, wherein the coordinate axis is an axis having the difference between the hot side temperature and the cold side temperature as zero in the thermoelectric relationship equation, and the processing unit estimates a thermal conductance of the thermoelectric module according to S, I, $T_c$, R, and $\Delta T$ or according to S, I, $T_h$, R, and $\Delta T$.

25. The measurement apparatus according to claim 24 further comprising:
a heat insulator, disposed on the cold side; and
a temperature control element, disposed on the hot side to regulate the temperature of the hot side, wherein the processing unit calculates $(SIT_c - I^2R/2)/\Delta T$ to obtain the thermal conductance of the thermoelectric module.

26. The measurement apparatus according to claim 24 further comprising:
a temperature control element, disposed on the cold side to regulate the temperature of the cold side; and
a heat insulator, disposed on the hot side, wherein the processing unit calculates $(SIT_h + I^2R/2)/\Delta T$ to obtain the thermal conductance of the thermoelectric module.

27. The measurement apparatus according to claim 24, wherein the thermoelectric module comprises a first substrate, a second substrate, and M pairs of thermoelectric pillars electrically connected with each other, wherein M is a positive integer, each pair of the thermoelectric pillars connects the first substrate and the second substrate, and the processing unit multiplies the thermal conductance of the thermoelectric module by h and divided by product of A and 2M to obtain a thermal conductivity of each of the thermoelectric pillars, wherein A is a sectional area of one of the thermoelectric pillars in a third direction substantially perpendicular to a direction of the current, and h is a height of the thermoelectric pillar in a fourth direction substantially parallel to the direction of the current.

28. The measurement apparatus according to claim 18 further comprising:
a heat insulator, disposed on the cold side; and
a temperature control element, disposed on the hot side to regulate the temperature of the hot side.

29. The measurement apparatus according to claim 28, wherein the temperature control element comprises one or a combination of a cold plate with a flow channel containing a fluid and a hot plate with a heating unit.

30. The measurement apparatus according to claim 18 further comprising:
a temperature control element, disposed on the cold side to regulate the temperature of the cold side; and
a heat insulator, disposed on the hot side.

31. The measurement apparatus according to claim 30, wherein the temperature control element comprises one or a combination of a cold plate with a flow channel containing a fluid and a hot plate with a heating unit.

32. The measurement apparatus according to claim 18 further comprising:
two heat insulators, respectively disposed on the hot side and the cold side.

33. The measurement apparatus according to claim 32 further comprising:
a constant temperature cabinet, wherein the thermoelectric module and the heat insulators are placed in the constant temperature cabinet.

34. The measurement apparatus according to claim 18, wherein the current is substantially a constant current.

35. A non-transitory computer readable medium having a computer program product in a computer readable medium for measuring a thermoelectric module, the computer program product comprising:
first instructions for providing a temperature to the thermoelectric module;
second instructions for applying a current to the thermoelectric module to turn both sides of the thermoelectric module respectively into a hot side and a cold side, wherein temperature of the hot side is higher than temperature of the cold side;
third instructions for measuring a terminal voltage of the thermoelectric module, a hot side temperature of the hot side, and a cold side temperature of the cold side at each of a plurality of time points during a first time;
fourth instructions for calculating a plurality of differences between the hot side temperatures and the corresponding cold side temperatures according to the terminal voltages, the hot side temperatures, and the cold side temperatures measured at the time points during the first time to obtain a thermoelectric relationship between the terminal voltages and the differences;

fifth instructions for estimating at least one first parameter of the thermoelectric module according to the thermoelectric relationship;

instructions for measuring the cold side temperature of the cold side or the hot side temperature of the hot side during a second time after the first time; and instructions for estimating a second parameter according to the at least one first parameter and the cold side temperature or the hot side temperature measured during the second time.

36. The non-transitory computer readable medium according to claim 35, wherein the fourth instructions comprise instructions for performing a linear regression according to the terminal voltages measured at the time points during the first time and the differences corresponding to the terminal voltages to obtain a thermoelectric relationship equation.

37. The non-transitory computer readable medium according to claim 36, wherein the fifth instructions comprise:

instructions for utilizing a slope of a straight line represented by the thermoelectric relationship equation to serve as a Seebeck coefficient of the thermoelectric module.

38. The non-transitory computer readable medium according to claim 37, wherein the thermoelectric module comprises a first substrate, a second substrate, and M pairs of thermoelectric pillars electrically connected with each other, wherein M is a positive integer, each pair of the thermoelectric pillars is connected to the first substrate and the second substrate, and the computer program product further comprises:

sixth instructions for dividing the Seebeck coefficient of the thermoelectric module by 2M to obtain an average Seebeck coefficient of each of the thermoelectric pillars.

39. The non-transitory computer readable medium according to claim 36, wherein the fifth instructions comprise:

instructions for utilizing a first value obtained by dividing value of the current into an intercept between the thermoelectric relationship equation and a coordinate axis to serve as an internal resistance of the thermoelectric module, wherein the coordinate axis is an axis having the difference between the hot side temperature and the cold side temperature as zero in the thermoelectric relationship equation.

40. The non-transitory computer readable medium according to claim 39, wherein the thermoelectric module comprises a first substrate, a second substrate, and M pairs of thermoelectric pillars electrically connected with each other, wherein M is a positive integer, each pair of the thermoelectric pillars is connected to the first substrate and the second substrate, and the computer program product further comprises:

seventh instructions for multiplying the internal resistance of the thermoelectric module by A and divided by product of h and 2M to obtain a resistivity of each of the thermoelectric pillars, wherein A is a sectional area of one of the thermoelectric pillars in a first direction substantially perpendicular to a direction of the current, and h is a height of the thermoelectric pillar in a second direction substantially parallel to the direction of the current.

41. The non-transitory computer readable medium according to claim 35, wherein a difference between the hot side temperature and the corresponding cold side temperature measured during the second time, the cold side temperature, and the hot side temperature are respectively $\Delta T$, $T_c$, and $T_h$, the current is I, the fourth instructions comprise instructions for performing a linear regression according to the terminal voltages measured at the time points during the first time and the differences corresponding to the terminal voltages to obtain a thermoelectric relationship equation, and the fifth instructions comprise:

instructions for utilizing a slope of a straight line represented by the thermoelectric relationship equation to serve as a Seebeck coefficient S of the thermoelectric module; and instructions for utilizing a second value obtained by dividing value of the current into an intercept between the thermoelectric relationship equation and a coordinate axis to serve as an internal resistance R of the thermoelectric module, wherein the coordinate axis is an axis having the difference between the hot side temperature and the cold side temperature as zero in the thermoelectric relationship equation; and the instructions for estimating the second parameter according to the at least one first parameter and the cold side temperature or the hot side temperature measured during the second time the ninth instructions comprise instructions for estimating a thermal conductance of the thermoelectric module according to S, I, $T_c$, R, and $\Delta T$ or according to S, I, $T_h$, R, and $\Delta T$.

42. The non-transitory computer readable medium according to claim 41, wherein a heat insulator is disposed on the cold side, a temperature control element is disposed on the hot side, the first instructions comprise instructions for instructing the temperature control element to regulate the temperature of the hot side, and the instructions for estimating the thermal conductance of the thermoelectric module according to S, I, $T_c$, R, and $\Delta T$ or according to S, I, $T_h$, R, and $\Delta T$ comprise instructions for calculating $(SIT_c - I^2R/2)/\Delta T$ to obtain the thermal conductance of the thermoelectric module.

43. The non-transitory computer readable medium according to claim 41, wherein a temperature control element is disposed on the cold side, a heat insulator is disposed on the hot side, the first instructions comprise instructions for instructing the temperature control element to regulate the temperature of the cold side, and the instructions for estimating the thermal conductance of the thermoelectric module according to S, I, $T_c$, R, and $\Delta T$ or according to S, I, $T_h$, R, and $\Delta T$ comprise instructions for calculating $(SIT_h + I^2R/2)/\Delta T$ to obtain the thermal conductance of the thermoelectric module.

44. The non-transitory computer readable medium according to claim 41, wherein the thermoelectric module comprises a first substrate, a second substrate, and M pairs of thermoelectric pillars electrically connected with each other, wherein M is a positive integer, each pair of the thermoelectric pillars connects the first substrate and the second substrate, and the computer program product further comprises:

instructions for multiplying the thermal conductance of the thermoelectric module by h and divided by product of A and 2M to obtain a thermal conductivity of each of the thermoelectric pillars, wherein A is a sectional area of one of the thermoelectric pillars in a third direction substantially perpendicular to a direction of the current, and h is a height of the thermoelectric pillar in a fourth direction substantially parallel to the direction of the current.

45. The non-transitory computer readable medium to claim 35, wherein a heat insulator is disposed on the cold side, a temperature control element is disposed on the hot side, and the first instructions comprise instructions for instructing the temperature control element to regulate the temperature of the hot side.

46. The non-transitory computer readable medium according to claim 35, wherein a temperature control element is disposed on the cold side, a heat insulator is disposed on the hot side, and the first instructions comprise instructions for instructing the temperature control element to regulate the temperature of the cold side.

47. The non-transitory computer readable medium according to claim 35, wherein a heat insulator is disposed on each of the hot side and the cold side, and the first instructions comprise instructions for providing a stable ambient temperature to the thermoelectric module.

48. The non-transitory computer readable medium according to claim 47, wherein the thermoelectric module and the heat insulators are placed in a constant temperature cabinet, and the instructions for providing the stable ambient temperature to the thermoelectric module comprise instructions for controlling the constant temperature cabinet to provide the stable ambient temperature to the thermoelectric module.

49. The non-transitory computer readable medium according to claim 35, wherein the current is substantially a constant current.

* * * * *